United States Patent
Ko et al.

(10) Patent No.: US 11,107,918 B2
(45) Date of Patent: Aug. 31, 2021

(54) SEMICONDUCTOR STRUCTURE FOR FULLY DEPLETED SILICON-ON-INSULATOR (FDSOI) TRANSISTOR

(71) Applicant: MediaTek Singapore Pte. Ltd., Singapore (SG)

(72) Inventors: Jen-Wei Ko, San Jose, CA (US); Zheng Zeng, San Jose, CA (US); Sheng-Yi Huang, Hsinchu (TW)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/829,071

(22) Filed: Mar. 25, 2020

(65) Prior Publication Data

US 2020/0365731 A1    Nov. 19, 2020

Related U.S. Application Data (60) Provisional application No. 62/846,805, filed on May 13, 2019.

(51) Int. Cl.
*H01L 29/78* (2006.01)
*H01L 29/10* (2006.01)
(Continued)

(52) U.S. Cl.
CPC ...... *H01L 29/7838* (2013.01); *H01L 23/5286* (2013.01); *H01L 29/0649* (2013.01); *H01L 29/1083* (2013.01)

(58) Field of Classification Search
CPC ........... H01L 29/7838; H01L 29/78603; H01L 29/1083; H01L 29/0649; H01L 23/5286
(Continued)

(56) References Cited

U.S. PATENT DOCUMENTS 65,262,666      5/2003  Park et al.
9,099,354 B2    8/2015  Weber et al.
(Continued)

FOREIGN PATENT DOCUMENTS

FR      3 007 577 A1     12/2014
WO      2012/161859 A1   11/2012

OTHER PUBLICATIONS

European Search Report dated Sep. 2, 2020, issued in application No. EP 20172844.1.

*Primary Examiner* — Dao H Nguyen
(74) *Attorney, Agent, or Firm* — McClure, Qualey & Rodack, LLP (57) ABSTRACT

A semiconductor structure is provided. The semiconductor structure includes a semiconductor substrate, an N-type well region over the semiconductor substrate, a FDSOI transistor formed over the N-type well region, a first shallow trench isolation (STI) region over the N-type well region, a first N-type doped region over the N-type well region, a second STI region over the semiconductor substrate, a first P-type doped region over the semiconductor substrate, and a first interconnection element over the first P-type doped region. The first P-type doped region is separated from the first N-type doped region by the second STI region. The first interconnection element is configured to connect the first P-type doped region to a ground. No interconnection element is formed over the first N-type doped region so that the first N-type doped region and the N-type well region are floating.

20 Claims, 5 Drawing Sheets

(51) Int. Cl.
*H01L 29/06* (2006.01)
*H01L 23/528* (2006.01)

(58) Field of Classification Search
USPC .......... 257/348, 347, 351, 392, 379, E27.06,
257/E27.066, E27.112, E29.02, E29.021,
257/E29.156, E21.334, E21.335, E21.345;
438/151, 237, 510
See application file for complete search history.

(56) References Cited

U.S. PATENT DOCUMENTS

| | | | |
|---|---|---|---|
| 9,337,302 B2 * | 5/2016 | Fenouillet-Beranger | .................... H01L 27/0296 |
| 9,660,034 B1 * | 5/2017 | Galy | ................... H01L 29/1083 |
| 2011/0115553 A1 * | 5/2011 | Cai | ......................... H01L 21/84 327/537 |
| 2013/0214356 A1 * | 8/2013 | Cheng | ................. H01L 27/1203 257/347 |
| 2013/0321057 A1 | 12/2013 | Soussan et al. | |
| 2016/0013205 A1 * | 1/2016 | Vinet | .................... H01L 21/762 257/351 |
| 2017/0200743 A1 * | 7/2017 | Flachowsky | ...... H01L 21/32139 |
| 2018/0159471 A1 | 6/2018 | Zhang | |
| 2020/0099377 A1 * | 3/2020 | Tipple | ................ H03K 19/0013 |

* cited by examiner

SEMICONDUCTOR STRUCTURE FOR FULLY DEPLETED SILICON-ON-INSULATOR (FDSOI) TRANSISTOR

CROSS REFERENCE TO RELATED APPLICATIONS

This Application claims priority of U.S. Provisional Application No. 62/846,805, filed on May 13, 2019, the entirety of which is incorporated by reference herein.

BACKGROUND OF THE INVENTION

Field of the Invention

The invention relates to a semiconductor structure, and more particularly to a semiconductor structure including a fully depleted silicon-on-insulator (FDSOI) transistor.

Description of the Related Art

Over the past few decades, the size of transistors has been continuously scaled down in order to increase performance and reduce power consumption, leading to better electronic devices that are able to do more useful, important, and valuable things faster, more clearly, and more efficiently.

Semiconductor-on-insulator (SOI) technology is an attractive candidate to push forward the frontiers imposed by Moore's law. Fully depleted SOI (FDSOI) techniques in particular may provide promising technologies that allow the fabrication of semiconductor devices at technology nodes of 28 nm and beyond. Aside from FDSOI techniques allowing the combination of high performance and low power consumption, complemented by an excellent responsiveness to power management design techniques, the fabrication processes employed in FDSOI techniques are comparatively simple and actually represent a low-risk evolution of conventional planar bulk CMOS techniques.

BRIEF SUMMARY OF THE INVENTION

Semiconductor structures are provided for a fully depleted silicon-on-insulator (FDSOI) transistor. An embodiment of a semiconductor structure is provided. The semiconductor structure includes a semiconductor substrate, an N-type well region over the semiconductor substrate, a FDSOI transistor formed over the N-type well region, a first shallow trench isolation (STI) region over the N-type well region, a first N-type doped region over the N-type well region, a second STI region over the semiconductor substrate, a first P-type doped region over the semiconductor substrate, and a first interconnection element over the first P-type doped region. The FDSOI transistor includes a buried oxide layer over the N-type well region, a source region over the buried oxide layer, a drain region over the buried oxide layer, a silicon-on-insulator (SOI) layer over the buried oxide layer and between the source and drain regions, and a metal gate over the SOI. The first N-type doped region is separated from the drain region of the FDSOI transistor by the first STI region. The first P-type doped region is separated from the first N-type doped region by the second STI region. The first interconnection element is configured to connect the first P-type doped region to a ground. No interconnection element is formed over the first N-type doped region so that the first N-type doped region and the N-type well region are floating.

Furthermore, an embodiment of a semiconductor structure is provided. The semiconductor structure includes a semiconductor substrate, an N-type well region over the semiconductor substrate, an undoped layer over the semiconductor substrate and in contact with the N-type well region, a fully depleted silicon-on-insulator (FDSOI) transistor formed over the N-type well region, a first shallow trench isolation (STI) region over the undoped layer, a first P-type doped region over the undoped layer, and a first interconnection element over the first P-type doped region. The FDSOI transistor includes a buried oxide layer over the N-type well region, a source region over the buried oxide layer, a drain region over the buried oxide layer, a silicon-on-insulator (SOI) layer over the buried oxide layer and between the source and drain regions, and a metal gate over the SOI. The first P-type doped region is separated from the drain region of the FDSOI transistor by the first STI region. The first interconnection element is configured to connect the first P-type doped region to a ground.

Moreover, an embodiment of a semiconductor structure is provided. The semiconductor structure includes a semiconductor substrate, an undoped layer over the semiconductor substrate, a N-type well region over the semiconductor substrate and between a first region and a second region of the undoped layer, a fully depleted silicon-on-insulator (FDSOI) transistor formed over the N-type well region, a first shallow trench isolation (STI) region over the first region of the undoped layer, a first P-type doped region over the first region of the undoped layer, a second STI region over the second region of the undoped layer, and a second P-type doped region over the second region of the undoped layer. The FDSOI transistor includes a buried oxide layer over the N-type well region, a source region over the buried oxide layer, a drain region over the buried oxide layer, a silicon-on-insulator (SOI) layer over the buried oxide layer and between the source and drain regions, and a metal gate over the SOI. The first P-type doped region is separated from the drain region of the FDSOI transistor by the first STI region. The second P-type doped region is separated from the source region of the FDSOI transistor by the second STI region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

Figure 1:
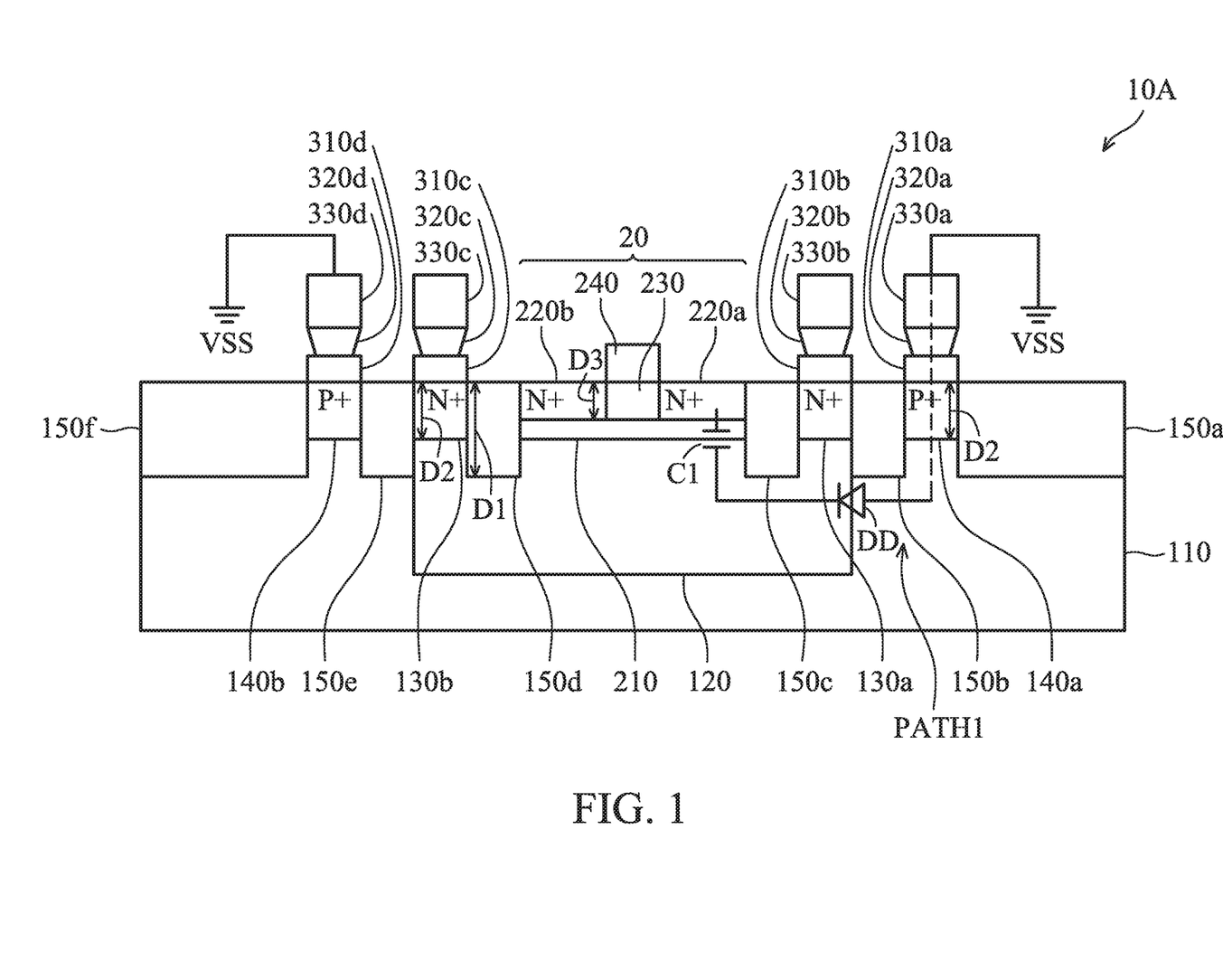
FIG. 1 shows a cross-sectional view of a semiconductor structure according to an embodiment of the invention.

FIG. 1 shows a cross-sectional view of a semiconductor structure 10A according to an embodiment of the invention. An N-type well region 120 is formed on a semiconductor substrate 110. The semiconductor substrate 110 may be made of silicon or other semiconductor materials, and the semiconductor substrate 110 is a P-type substrate. A fully depleted silicon-on-insulator (FDSOI) transistor 20 is formed over the N-type well region 120. A buried oxide (BOX) layer 210 is formed over the N-type well region 120. In some embodiments, the BOX layer 210 may be formed of SiO2, SiN, or combination. The N-type doped regions 220a and 220b are formed over the BOX layer 210. A silicon-on-insulator (SOI) layer 230 is formed over the BOX layer 210 and between the N-type doped regions 220a and 220b. A metal gate 240 is formed over the SOI layer 230. The N-type doped regions 220a and 220b form the drain and source regions of the FDSOI transistor 20, respectively. Furthermore, a channel of the FDSOI transistor 20 is formed between the N-type doped regions 220a and 220b and below the metal gate 240. In order to simplify the description, other features of the FDSOI transistor 20, such as gate dielectric layer and so on, are omitted. In some embodiments, a heavy doping N-type well region is formed between the N-type well region 120 and the semiconductor substrate 110.

In FIG. 1, the N-type doped regions 130a and 130b are formed over the N-type well region 120. The N-type doped region 130a is separated from the N-type doped region 220a (i.e., the drain region of the FDSOI transistor 20) by a shallow trench isolation (STI) region 150c, and the N-type doped region 130b is separated from the N-type doped region 220b (i.e., the source region of the FDSOI transistor 20) by a STI region 150d. The STI regions 150c and 150d are formed over the N-type well region 120. The N-type doped regions 130a and 130b are the pick-up regions for the N-type well region 120. The depth D1 of the STI regions 150c and 150d is greater than the depth D2 of the N-type doped regions 130a and 130b. Furthermore, the depth D2 of the N-type doped regions 130a and 130b is greater than the depth D3 of the N-type doped regions 220a and 220b.

The STI regions 150a and 150b and the P-type doped region 140a are formed over the semiconductor substrate 110. In some embodiments, a P-type well region (not shown) is formed over the semiconductor substrate 110, and the STI regions 150a and 150b and the P-type doped region 140a are formed over the P-type well region on the right side of the N-type well region 120. The STI region 150b is in contact with the N-type well region 120 and the N-type doped region 130a. The P-type doped region 140a is separated from the N-type doped region 130a by the STI region 150b, and the P-type doped region 140a is disposed between the STI regions 150a and 150b. The P-type doped region 140a has the same depth as the N-type doped region 130a, i.e., the depth D1. Similarly, the STI regions 150e and 150f and the P-type doped region 140b are formed over the semiconductor substrate 110. In some embodiments, a P-type well region (not shown) is formed over the semiconductor substrate 110, and the STI regions 150e and 150f and the P-type doped region 140b are formed over the P-type well region on the left side of the N-type well region 120. The STI region 150e is in contact with the N-type well region 120 and the N-type doped region 130b. The P-type doped region 140b is separated from the N-type doped region 130b by the STI region 150e, and the P-type doped region 140b is disposed between the STI regions 150e and 150f. The P-type doped region 140b has the same depth as the N-type doped region 130b, i.e., the depth D1. The P-type doped regions 140a and 140b are the pick-up regions for the semiconductor substrate 110.

In FIG. 1, a plurality of interconnect layers are formed over the N-type doped regions 130a and 130b, and the P-type doped regions 140a and 140b. The contacts 310a through 310d are the interconnect elements of a first interconnect layer. For example, the contact 310a is formed on the P-type doped region 140a, the contact 310b is formed on the N-type doped region 130a, the contact 310c is formed on the N-type doped region 130b, and the contact 310d is formed on the P-type doped region 140b.

The vias 320a through 320d are the interconnect elements of a second interconnect layer over the first interconnect layer. For example, the via 320a is formed on the contact 310a, the via 320b is formed on the contact 310b, the via 320c is formed on the contact 310c, and the via 320d is formed on the contact 310d. Furthermore, the metals 330a through 330d are the interconnect elements of a third interconnect layer over the second interconnect layer. For example, the metal 330a is formed on the via 320a, the metal 330b is formed on the via 320b, the metal 330c is formed on the via 320c, and metal 330d is formed on the via 320d.

In the semiconductor structure 10A, a parasitic capacitor C1 is formed by the N-type doped region 220a, the BOX layer 210 and the N-type well region 120. In some embodiments, the parasitic capacitor C1 is adjacent to the STI region 150c. Furthermore, the semiconductor substrate 110 and the N-type well region 120 form a PN junction to operate as a parasitic diode DD. Therefore, a parasitic path PATH1 including the parasitic capacitor C1 and the parasitic diode DD is formed between the N-type well region 220a and the P-type well region 140a. In some embodiments, the parasitic diode DD is adjacent to the STI region 150b. Similarly, a parasitic capacitor (not shown) is formed by the N-type doped region 220b, the BOX layer 210 and the N-type well region 120. Furthermore, the semiconductor substrate 110 and the N-type well region 120 form a PN junction to operate as a parasitic diode (not shown) that is adjacent to the STI region 150e, thus another parasitic path (not shown) is formed between the N-type well region 220b and the P-type well region 310d. In order to simplify the description, only the path PATH1 is illustrated below.

In some embodiments, figure of merit (FOM) is an insertion loss for the FDSOI transistor 20 used as a switch. Furthermore, the FOM of the FDSOI transistor 20 is mainly obtained according to the following equation:

$$FOM \cong Ron \times Coff,$$

where Ron represent the on-resistance of the FDSOI transistor 20, and Coff represent the parasitic capacitor of the FDSOI transistor 20. In some embodiments, the parasitic capacitor of the FDSOI transistor 20 is dominated from the drain capacitors of the FDSOI transistor 20. For the FDSOI transistor 20, the drain capacitors are parasitic capacitors. In some embodiments, the drain capacitors include a drain-gate capacitor Cdg, a drain-source capacitor Cds, and a drain-bulk capacitor Cdb. The capacitance value of the drain capacitors is mainly determined by the drain-bulk capacitor Cdb.

In FIG. 1, the anode of the parasitic diode DD is coupled to a ground VSS through the P-type doped region 140a, the contact 310a, the via 320a and the metal 330b. Thus, the parasitic diode DD will not be forward biased. Similarly, the P-type doped region 140b, the contact 310d, the via 320d and the metal 330d are coupled to the ground VSS. Furthermore, the N-type doped region 130a is floating, i.e., no signal or power line is connected to the metal 330b, the via 320b and the contact 310b. Similarly, the N-type doped region 130b is floating, i.e., no signal or power line is connected to the metal 330c, the via 320c and the contact 310c.

In the semiconductor structure 10A, because no signal is applied to the N-type well region 120 through the N-type doped regions 130a and 130b, the N-type well region 120 is floating. Thus, N-type doped region 130a is high impedance for the parasitic capacitor C1, and the parasitic capacitor C1 is coupled to the ground VSS through the parasitic diode DD, the P-type doped region 140a, the contact 310a, the via 320a and the metal 330a. In other words, the capacitor C1 and an equivalent capacitor of the parasitic diode DD are coupled in serial between the drain region of the FDSOI transistor 20 and the ground VSS. In general, capacitors coupled in series will reduce the capacitance of the capacitors coupled in series. Thus, the drain-bulk capacitor Cdb of the FDSOI transistor 20 is obtained by connecting the parasitic capacitor C1 and the equivalent capacitor of the parasitic diode DD in series, and the drain-bulk capacitor Cdb of the FDSOI transistor 20 has less capacitance than the parasitic capacitor C1. Therefore, the FDSOI transistor 20 of the semiconductor structure 10A has less FOM and less insertion loss.

Figure 2:
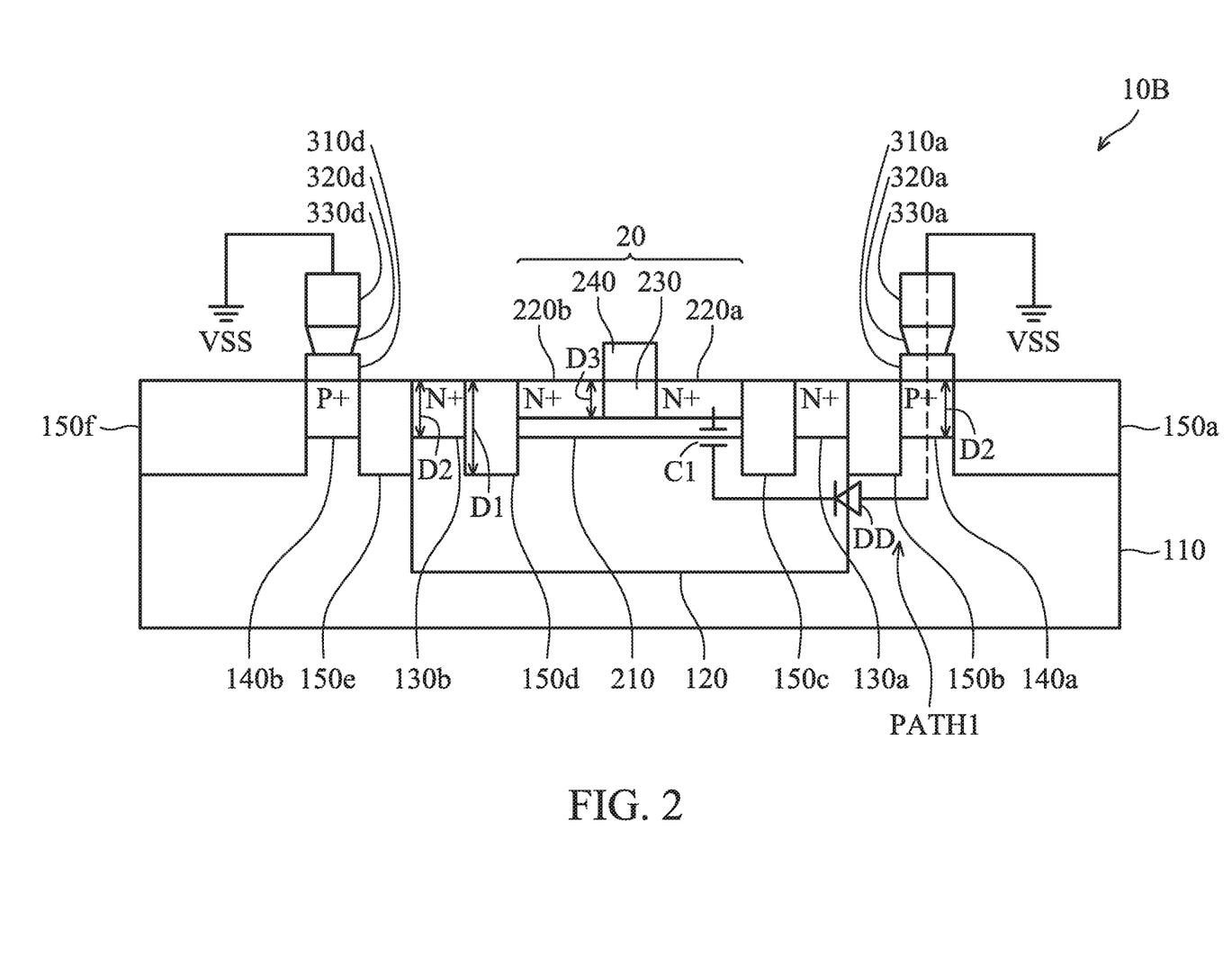
FIG. 2 shows a cross-sectional view of a semiconductor structure according to an embodiment of the invention.

FIG. 2 shows a cross-sectional view of a semiconductor structure 10B according to an embodiment of the invention. The configuration of the semiconductor structure 10B is similar to the semiconductor structure 10A of FIG. 1, and the difference between the semiconductor structure 10A of FIG. 1 and the semiconductor structure 10B of FIG. 2 is that no interconnect elements (e.g., the contacts 310b and 310c, the vias 320b and 320c and the metals 330b and 330c of FIG. 1) are formed on the N-type doped regions 130a and 130b in the semiconductor structure 10B.

Figure 3:
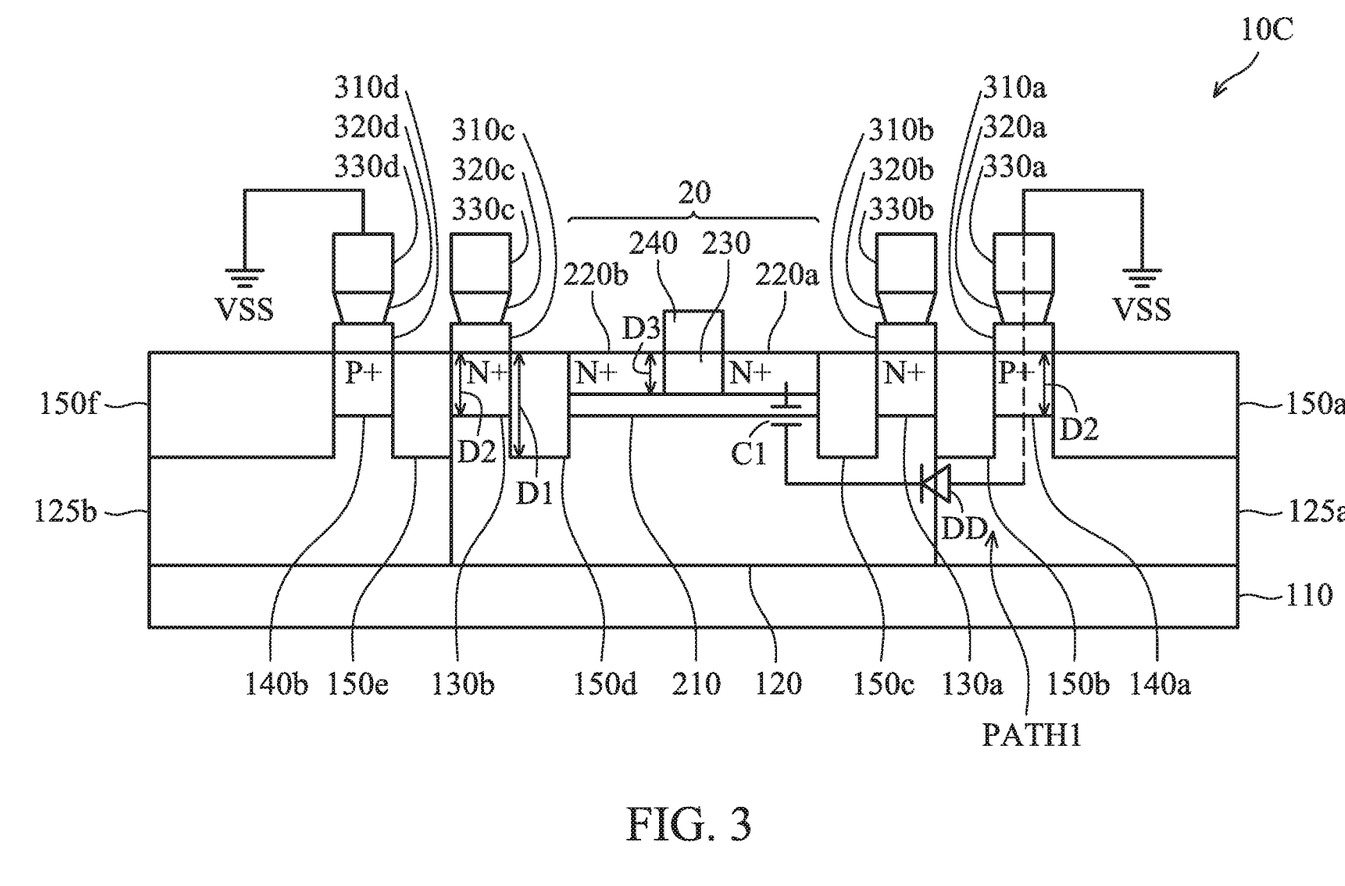
FIG. 3 shows a cross-sectional view of a semiconductor structure according to an embodiment of the invention.

FIG. 3 shows a cross-sectional view of a semiconductor structure 10C according to an embodiment of the invention. The configuration of the semiconductor structure 10C is similar to the semiconductor structure 10A of FIG. 1, and the difference between the semiconductor structure 10A of FIG. 1 and the semiconductor structure 10C of FIG. 3 is that an undoped layer 125a/125b is formed over the semiconductor substrate 120 in FIG. 3. Furthermore, the STI regions 150a and 150b and the P-type doped region 140a are formed over a first region of the undoped layer 125a, and the STI regions 150d and 150e and the P-type doped region 140b are formed over the a second region of undoped layer 125b. The undoped layer 125a/125b is used to provide high isolation (or high impedance) for the parasitic capacitor C1. In some embodiments, the undoped layer 125a/125b is not doped with impurities. An equivalent capacitor of the first region the undoped layer 125a is coupled to the parasitic capacitor C1. Thus, the drain-bulk capacitor Cdb of the FDSOI transistor 20 has less capacitance than the parasitic capacitor C1. Therefore, the FDSOI transistor 20 of the semiconductor structure 10C has less FOM and less insertion loss.

In some embodiments, the undoped layer 125a/125b is a light doping P-type well region. Thus, the first region of the undoped layer 125a and the N-type well region 120 form a PN junction to operate as a parasitic diode DD. As described above, the capacitor C1 and an equivalent capacitor of the parasitic diode DD are coupled in serial between the drain region of the FDSOI transistor 20 and the ground VSS. In general, capacitors coupled in series will reduce the capacitance of the capacitors coupled in series. Thus, the drain-bulk capacitor Cdb of the FDSOI transistor 20 is obtained by connecting the parasitic capacitor C1 and an equivalent capacitor of the parasitic diode DD in series, and the drain-bulk capacitor Cdb of the FDSOI transistor 20 has less capacitance than the parasitic capacitor C1. Therefore, the FDSOI transistor 20 of the semiconductor structure 10C has less FOM and less insertion loss.

Figure 4:
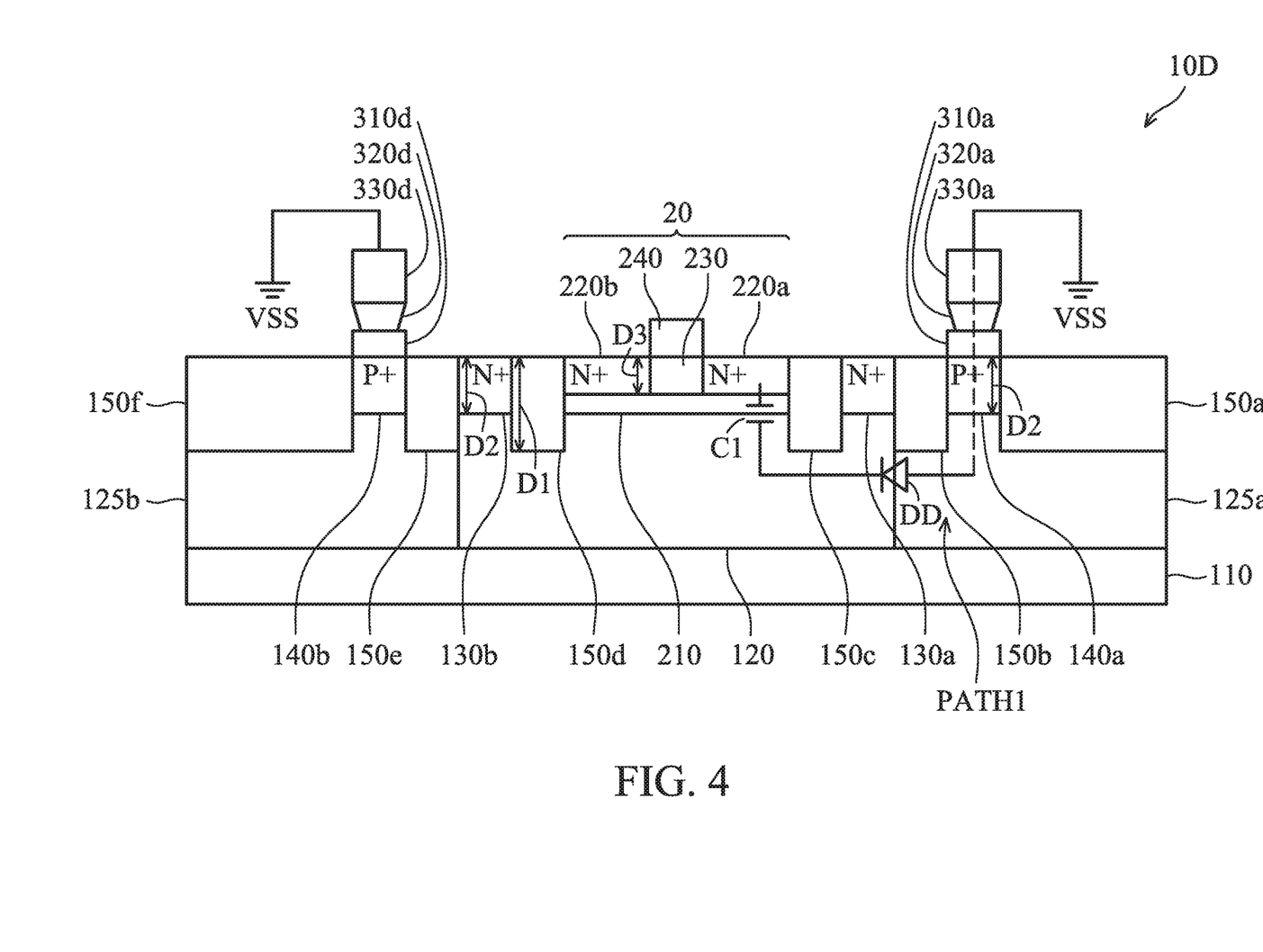
FIG. 4 shows a cross-sectional view of a semiconductor structure according to an embodiment of the invention.

FIG. 4 shows a cross-sectional view of a semiconductor structure 10D according to an embodiment of the invention. The configuration of the semiconductor structure 10B is similar to the semiconductor structure 10C of FIG. 3, and the difference between the semiconductor structure 10C of FIG. 3 and the semiconductor structure 10D of FIG. 4 is that no interconnect elements (e.g., the contacts 310b and 310c, the vias 320b and 320c and the metals 330b and 330c of FIG. 3) are formed on the N-type doped regions 130a and 130b in the semiconductor structure 10D.

Figure 5:
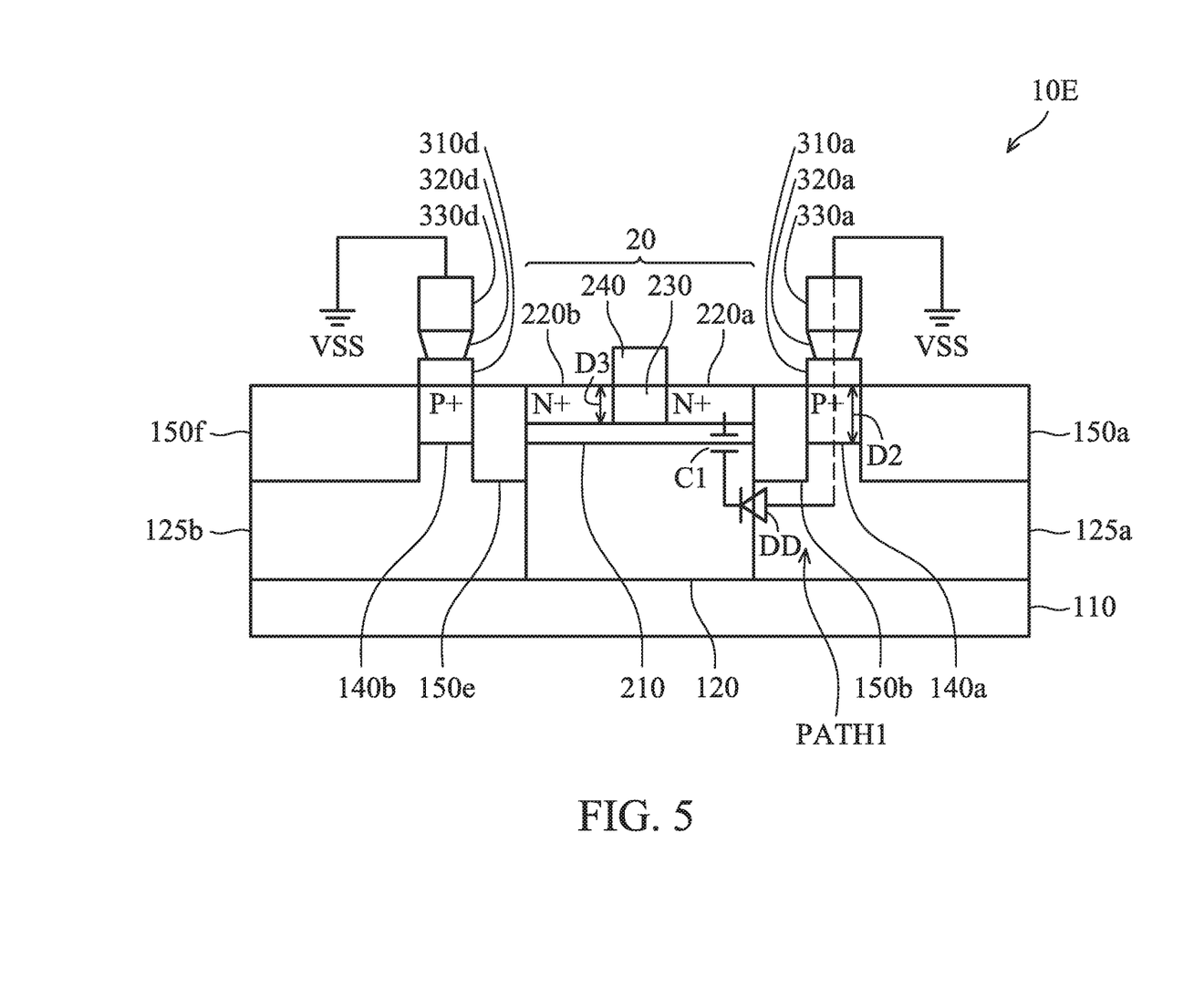
FIG. 5 shows a cross-sectional view of a semiconductor structure according to an embodiment of the invention.

FIG. 5 shows a cross-sectional view of a semiconductor structure 10E according to an embodiment of the invention. The configuration of the semiconductor structure 10B is similar to the semiconductor structure 10C of FIG. 3, and the difference between the semiconductor structure 10C of FIG. 3 and the semiconductor structure 10E of FIG. 5 is that no pick-up regions for the N-type well region 120 is present in FIG. 5. Compared with the semiconductor structure 10C of FIG. 3, no STI regions 150c and 150d and no N-type doped regions 130a and 130b are formed over the N-type well region 120. Thus, the area of the N-type well region 120 is decreased in the semiconductor structure 10E, and the area of the FDSOI transistor 20 is also decreased. In the semiconductor structure 10E, the N-type doped region 220a (i.e., the drain region of the FDSOI transistor 20) is separated from the P-type doped region 140a by a STI region 150b, and the N-type doped region 220b (i.e., the source region of the FDSOI transistor 20) is separated from the P-type doped region 140b by a STI region 150e.

The undoped layer 125a/125b is formed over the semiconductor substrate 110, and the N-type well region 120 is formed over the semiconductor substrate 110 and between the first region of the undoped layer 125a and the second region of the undoped layer 125b. In some embodiments, the N-type well region 120 is surrounded by the undoped layer 125a/125b. Furthermore, the N-type well region 120 is contact with the undoped layer 125a/125b. As described above, the undoped layer 125a/125b is used to provide high isolation (or high impedance) for the parasitic capacitor C1. In some embodiments, the undoped layer 125a/125b is not doped with impurities. An equivalent capacitor of the first region of the undoped layer 125a is coupled to the parasitic capacitor C1. Thus, the drain-bulk capacitor Cdb of the FDSOI transistor 20 has less capacitance than the parasitic capacitor C1. Therefore, the FDSOI transistor 20 of the semiconductor structure 10C has less FOM and less insertion loss.

In FIG. 5, one side of the STI region 150b is in contact with the source region of the FDSOI transistor 20, the buried oxide layer 210 and the N-type well region 120. Furthermore, the opposite side of the STI region 150b is in contact with the P-type doped region 140a and the first region of the undoped layer 125a. Similarly, one side of the STI region 150e is in contact with the source region of the FDSOI transistor 20, the buried oxide layer 210 and the N-type well region 120, and the opposite side of the STI region 150e is in contact with the P-type doped region 140b and the second region of the undoped layer 125b.

Compared with the traditional transistors in the traditional RF switching circuit, the sources and drains of the FDSOI transistor (e.g., 20 of FIGS. 1-5) in a RF switching circuit do not need to be coupled to the ground through a resistor. In other words, no resistor coupled to the ground is present in the RF switching circuit. Thus, area and cost of the RF switching circuit are decreased. Furthermore, insertion loss is decreased for RF signal to be received or to be transmitted.

According to the embodiments, by floating the N-type well region 120 under the FDSOI transistors 20, the drain-bulk capacitor Cdb of the FDSOI transistor 20 is decreased. For the FDSOI transistor 20, the capacitance value of the drain capacitors is mainly determined by the drain-bulk capacitor Cdb. Therefore, the FDSOI transistor 20 has less FOM and less insertion loss. Furthermore, by using the undoped layer 125a/125b, the pick-up regions of the N-type well region 120 can be removed. Thus, the area of the FDSOI transistor 20 is decreased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
    a semiconductor substrate;
    an N-type well region over the semiconductor substrate;
    a fully depleted silicon-on-insulator (FDSOI) transistor formed over the N-type well region, comprising:
        a buried oxide layer over the N-type well region;
        a source region over the buried oxide layer;
        a drain region over the buried oxide layer;
        a silicon-on-insulator (SOI) layer over the buried oxide layer and between the source and drain regions; and
        a metal gate over the SOI;
    a first shallow trench isolation (STI) region over the N-type well region;
    a first N-type doped region over the N-type well region, wherein the first N-type doped region is separated from the drain region of the FDSOI transistor by the first STI region;
    a second STI region over the semiconductor substrate;
    a first P-type doped region over the semiconductor substrate, wherein the first P-type doped region is separated from the first N-type doped region by the second STI region; and
    a first interconnection element over the first P-type doped region and configured to connect the first P-type doped region to a ground,
    wherein no interconnection element is formed over the first N-type doped region so that the first N-type doped region and the N-type well region are floating.

2. The semiconductor structure as claimed in claim 1, further comprising:
    an undoped layer over the semiconductor substrate, wherein the second STI region and the first P-type doped region are separated from the semiconductor substrate by the undoped layer.

3. The semiconductor structure as claimed in claim 1, wherein the first N-type doped region has a depth that is greater than that of the source and drain regions.

4. The semiconductor structure as claimed in claim 1, wherein a depth of the first N-type doped region is equal to that of the first P-type doped region.

5. The semiconductor structure as claimed in claim 1, wherein a depth of the first N-type doped region is less than that of the first and second STI regions.

6. The semiconductor structure as claimed in claim 1, further comprising:
    a third STI region over the N-type well region;
    a second N-type doped region over the N-type well region, wherein the second N-type doped region is separated from the source region of the FDSOI transistor by the third STI region;
    a fourth STI region over the semiconductor substrate;
    a second P-type doped region over the semiconductor substrate, wherein the second P-type doped region is separated from the second N-type doped region by the fourth STI region; and
    a second interconnection element over the second P-type doped region and configured to connect the second P-type doped region to the ground.

7. The semiconductor structure as claimed in claim 6, wherein no interconnection element is formed over the second N-type doped region so that the second N-type doped region is floating.

8. A semiconductor structure, comprising:
    a semiconductor substrate;
    an N-type well region over the semiconductor substrate;
    an undoped layer over the semiconductor substrate and in contact with the N-type well region;
    a fully depleted silicon-on-insulator (FDSOI) transistor formed over the N-type well region, comprising:
        a buried oxide layer over the N-type well region;
        a source region over the buried oxide layer;
        a drain region over the buried oxide layer;
        a silicon-on-insulator (SOI) layer over the buried oxide layer and between the source and drain regions; and
        a metal gate over the SOI layer;
    a first shallow trench isolation (STI) region over the undoped layer;
    a first P-type doped region over the undoped layer, wherein the first P-type doped region is separated from the drain region of the FDSOI transistor by the first STI region; and
    a first interconnection element over the first P-type doped region and configured to connect the first P-type doped region to a ground.

9. The semiconductor structure as claimed in claim 8, wherein the first P-type doped region has a depth that is greater than that of the source and drain regions.

10. The semiconductor structure as claimed in claim 8, wherein a depth of the first P-type doped region is less than that of the first STI region.

11. The semiconductor structure as claimed in claim 8, further comprising:
    a second STI region over the undoped layer;
    a second P-type doped region over the undoped layer, wherein the second P-type doped region is separated from the source region of the FDSOI transistor by the second STI region; and a second interconnection element over the second P-type doped region and configured to connect the second P-type doped region to the ground,
wherein the N-type well region is surrounded by the undoped layer.

12. The semiconductor structure as claimed in claim 11, further comprising:
a third STI region over the N-type well region; and
a first N-type doped region over the N-type well region and between the first and third STI regions,
wherein the first N-type doped region is separated from the drain region of the FDSOI transistor by the third STI region,
wherein no interconnection element is formed over the first N-type doped region so that the first N-type doped region and the N-type well region are floating.

13. The semiconductor structure as claimed in claim 12, further comprising:
a fourth STI region over the N-type well region; and
a second N-type doped region over the N-type well region and between the second and fourth STI regions,
wherein the second N-type doped region is separated from the source region of the FDSOI transistor by the fourth STI region,
wherein no interconnection element is formed over the second N-type doped region so that the second N-type doped region is floating.

14. A semiconductor structure, comprising:
a semiconductor substrate;
an undoped layer over the semiconductor substrate;
a N-type well region over the semiconductor substrate and between a first region and a second region of the undoped layer;
a fully depleted silicon-on-insulator (FDSOI) transistor formed over the N-type well region, comprising:
 a buried oxide layer over the N-type well region;
 a source region over the buried oxide layer;
 a drain region over the buried oxide layer;
 a silicon-on-insulator (SOI) layer over the buried oxide layer and between the source and drain regions; and
 a metal gate over the SOI layer;
a first shallow trench isolation (STI) region over the first region of the undoped layer;
a first P-type doped region over the first region of the undoped layer, wherein the first P-type doped region is separated from the drain region of the FDSOI transistor by the first STI region;
a second STI region over the second region of the undoped layer; and
a second P-type doped region over the second region of the undoped layer, wherein the second P-type doped region is separated from the source region of the FDSOI transistor by the second STI region.

15. The semiconductor structure as claimed in claim 14, wherein the first region of the undoped layer is separated from the second region of the undoped layer by the N-type well region, and the N-type well region is in contact with the first and second regions of the undoped layer.

16. The semiconductor structure as claimed in claim 14, wherein a depth of the first and second P-type doped regions is greater than that of the source and drain regions.

17. The semiconductor structure as claimed in claim 14, wherein a depth of the first and second P-type doped regions is less than that of the first and second STI regions.

18. The semiconductor structure as claimed in claim 14, wherein the first and second P-type doped regions are coupled to a ground.

19. The semiconductor structure as claimed in claim 14, wherein one side of the first STI region is in contact with the drain region of the FDSOI transistor, the buried oxide layer and the N-type well region, and an opposite side of the first STI region is in contact with the first P-type doped region and the first region of the undoped layer.

20. The semiconductor structure as claimed in claim 14, wherein one side of the second STI region is in contact with the source region of the FDSOI transistor, the buried oxide layer and the N-type well region, and the opposite side of the second STI region is in contact with the second P-type doped region and the second region of the undoped layer.

* * * * *